US009882377B2

(12) United States Patent
La Rosa et al.

(10) Patent No.: US 9,882,377 B2
(45) Date of Patent: Jan. 30, 2018

(54) ELECTROSTATIC DISCHARGE PROTECTION SOLUTIONS

(71) Applicant: International Business Machines Corporation, Armonk, NY (US)

(72) Inventors: Giuseppe La Rosa, Fishkill, NY (US); You Li, Essex Junction, VT (US); Wen Liu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 202 days.

(21) Appl. No.: 14/607,465

(22) Filed: Jan. 28, 2015

(65) Prior Publication Data

US 2016/0218503 A1    Jul. 28, 2016

(51) Int. Cl.
H02H 9/00        (2006.01)
H02H 9/04        (2006.01)
H01L 27/02       (2006.01)

(52) U.S. Cl.
CPC ......... H02H 9/046 (2013.01); H01L 27/0255 (2013.01)

(58) Field of Classification Search
CPC ....... H02H 9/06; H02H 9/046; H01L 27/0255
USPC .......................................................... 361/56
See application file for complete search history.

(56) References Cited

U.S. PATENT DOCUMENTS

| 5,563,757 | A | 10/1996 | Corsi |
| 5,991,135 | A | 11/1999 | Saleh |
| 6,040,968 | A | 3/2000 | Duvvury et al. |
| 6,479,883 | B1 | 11/2002 | Chen et al. |
| 6,507,471 | B2 | 1/2003 | Colclaser et al. |
| 6,680,839 | B2 * | 1/2004 | Napiorkowski ........ H04M 3/18 361/111 |
| 6,842,318 | B2 | 1/2005 | Comeau |
| 6,963,110 | B2 | 11/2005 | Woo et al. |
| 7,098,513 | B2 | 8/2006 | Chatty et al. |
| 7,679,869 | B2 | 3/2010 | Kuo et al. |
| 7,692,247 | B2 | 4/2010 | Woo et al. |
| 7,852,591 | B1 * | 12/2010 | Sutardja ................... G11B 5/40 360/323 |
| 8,373,956 | B2 | 2/2013 | Abou-Khalil et al. |
| 8,498,085 | B2 | 7/2013 | Altolaguirre et al. |
| 2012/0069478 | A1 | 3/2012 | Caplan et al. |
| 2014/0001491 | A1 | 1/2014 | Klein et al. |

FOREIGN PATENT DOCUMENTS

WO    1999013510 A1    3/1999

* cited by examiner

*Primary Examiner* — Stephen W Jackson
(74) *Attorney, Agent, or Firm* — Scully, Scott, Murphy & Presser, P.C.; Steven J. Meyers

(57) ABSTRACT

Electrostatic discharge protection circuits and methods for protecting a core circuit from an electrostatic discharge event. The protection circuit may include a first anti-parallel diode pair including a first terminal coupled to an input/output pad, and a second anti-parallel diode pair including a second terminal coupled to a negative power supply voltage. The second anti-parallel diode pair is coupled in series with the first anti-parallel diode pair at a node. An offset pad is coupled to the node. The offset pad is configured to receive a first signal that is a duplicate of a second signal that is received at the input/output pad.

19 Claims, 2 Drawing Sheets

ELECTROSTATIC DISCHARGE PROTECTION SOLUTIONS

BACKGROUND

The invention generally relates to semiconductor manufacturing and integrated circuits and, more particularly, to electrostatic discharge protection circuits and methods of protecting an integrated circuit from an electrostatic discharge event.

Electrostatic discharge (ESD) protection circuits are elements of an integrated circuit network and are used to protect the constituent semiconductor devices and circuits of the integrated circuit network against ESD induced damage. An integrated circuit may be exposed to transient electrostatic discharge (ESD) events that can direct potentially large and damaging ESD currents to the integrated circuits of the chip. An ESD event involves an electrical discharge from a source, such as the human body or a metallic object, over a short duration and can deliver a large amount of current to the integrated circuit. An integrated circuit may be protected from ESD events by, for example, incorporating an ESD protection circuit into the chip. The ESD protection circuit is usually connected to vulnerable terminals and, when activated, diverts ESD stress so that the integrated circuit network is bypassed and protected. During normal operation of the integrated circuit network, the ESD protection circuit is maintained in a deactivated condition.

Improved electrostatic discharge protection circuits are needed that provide electrostatic discharge protection and improved methods are needed for protecting an integrated circuit from an electrostatic discharge event.

SUMMARY

According to an embodiment of the invention, a method is provided for protecting a core circuit, which is coupled with an input/output pad, from an electrostatic discharge event. The method includes receiving a first signal at the input/output pad and receiving a second signal at an offset pad, which is coupled with a node between a first anti-parallel diode pair including a first terminal coupled to the input/output pad and a second anti-parallel diode pair including a second terminal coupled to a negative power supply voltage. The second signal is a duplicate of the first signal received at the input/output pad.

According to another embodiment of the invention, an electrostatic discharge protection circuit includes a first anti-parallel diode pair including a first terminal coupled to an input/output pad, and a second anti-parallel diode pair including a second terminal coupled to a negative power supply voltage. The second anti-parallel diode pair is coupled in series with the first anti-parallel diode pair at a node. An offset pad is coupled to the node. The offset pad is configured to receive a first signal that is a duplicate of a second signal that is received at the input/output pad.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
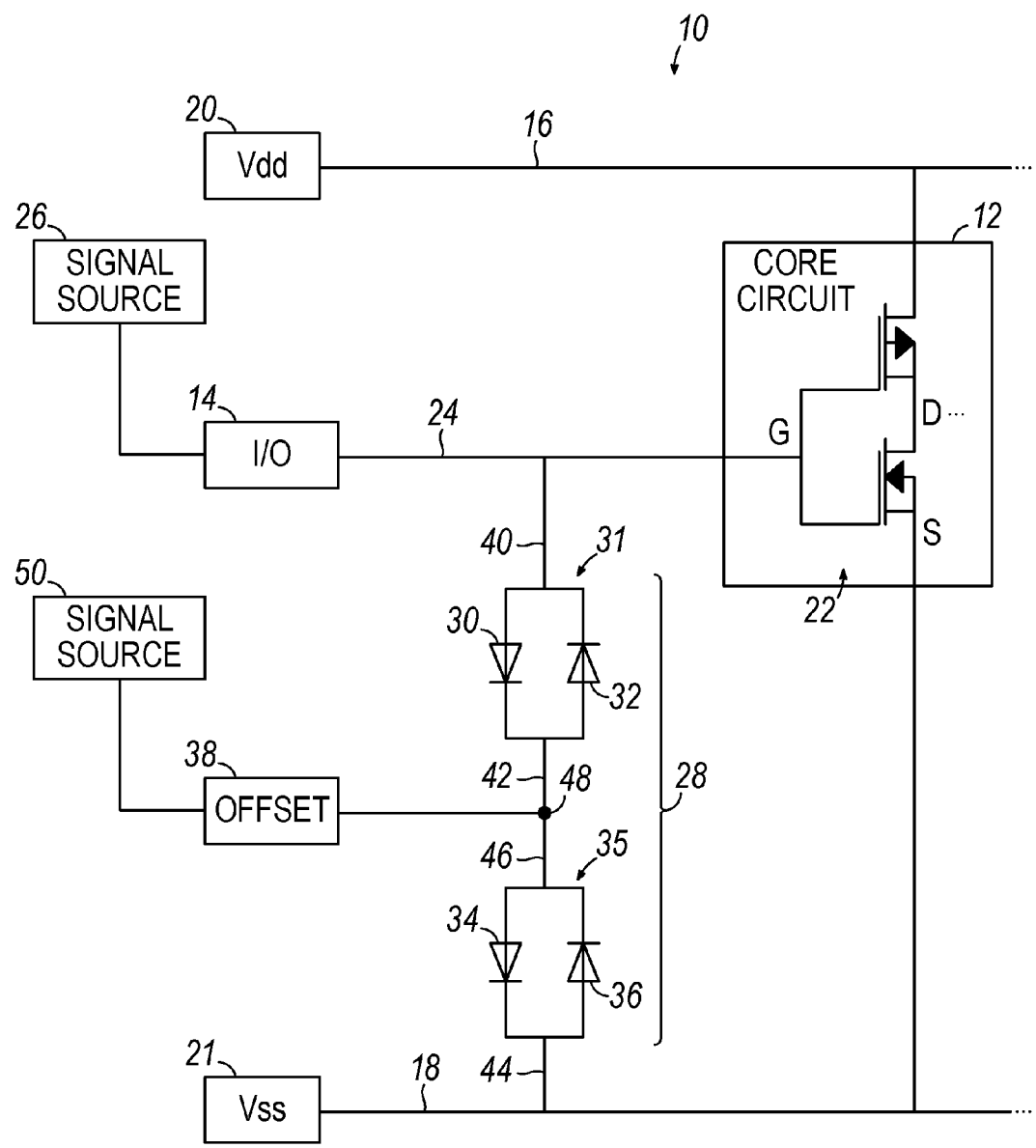
FIG. 1 is a circuit diagram that includes a protection circuit in accordance with an embodiment of the invention.

With reference to FIG. 1 and in accordance with an embodiment of the invention, a chip, generally indicated by reference numeral 10, includes a core circuit 12, an input/output (I/O) pad 14 coupled with the core circuit 12, a positive power supply (Vdd) rail 16 coupled with the core circuit 12, and a negative power supply (Vss) rail 18 coupled with the core circuit 12. The Vdd rail 16 is connected with a Vdd power pin at a pad 20 and the Vss rail 18 is connected with a Vss power pin at a pad 21. An external power supply is coupled with the Vdd and the Vss power pins. When the core circuit 12 is in normal operation, the negative power supply voltage at the Vss rail 18 may be fixed at a ground potential, the positive power supply voltage at the Vss rail 18 may be held at a voltage (e.g., 3.3 volts) commonly used to power an integrated circuit, and signals may be communicated from the external environment of the chip 10 to the core circuit 12 and from the core circuit to 12 the external environment of the chip 10 at the input/output pad 14.

The core circuit 12 of the chip may be comprised of devices formed by front-end-of-line (FEOL) processing and may include various specific circuits and devices, such as an inverter 22 with transistors fabricated by complementary-metal-oxide-semiconductor (CMOS) processes. The inverter 22 may comprise, as an example, an input of an input buffer circuit of the core circuit 12. The chip 10 may include wiring paths of an interconnect structure formed by middle-of-line (MOL) and back-end-of-line (BEOL) processing. These wiring paths may include wiring paths defining the Vdd rail 16, the Vss rail 18, and a wiring path 24 connecting the input/output pad 14 with the core circuit 12. The input/output pad 14 is a small conductive area in the topmost level of the interconnect structure on the chip 10 at which an external conductor can be coupled with the chip 10 and used to supply or receive signals. In the representative embodiment, the wiring path 24 couples the input/output pad 14 with the gates of the field-effect transistors forming the inverter 22. A signal source 26, which is coupled with the input/output pad 14, supplies signals to the core circuit 12.

The chip 10 further comprises a protection circuit 28 that includes diodes 30, 32 arranged in an anti-parallel diode pair 31, diodes 34, 36 arranged in an anti-parallel diode pair 35, and an offset pad 38. The anti-parallel diode pairs 31, 35 of the protection circuit 28 cooperate to protect the core circuit 12 from fast, transient, and high-voltage electrostatic discharge (ESD) events. Sources of ESD events include the human body described by the Human Body Model, metallic objects described by the Machine Model, and the chip itself should the chip charge and discharge to ground as described by the Charged Device Model. When the core circuit 12 is powered and receiving signals at the input/output pad 12 and in conjunction with duplicate signals supplied to the offset pad 38, anti-parallel diode pairs 31, 35 of the protection circuit 28 introduce either a negligible or zero leakage current to the protected core circuit 12.

Each of the diodes 30, 32, 34, 36 of the protection circuit 28 is a two-terminal electronic component characterized by an asymmetric conductance. The terminals of each of the diodes 30, 32, 34, 36 meet along a p-n junction. Each of the diodes 30, 32, 34, 36 has a low resistance (i.e., a high conductance) to current when biased in a forward direction and a high resistance (i.e., a low conductance) to current when biased in an opposite direction. In an embodiment, the diodes 30, 32, 34, 36 may comprise basic ESD diodes that are available in many process design kits (PDK). The design of the diodes 30, 32, 34, 36 is readily scalable to match different technology nodes (e.g., 32 nm, 45 nm, 90 nm, etc.) for fabricating the protection circuit 28 is these technology nodes.

A terminal 40 of the anti-parallel diode pair 31 is coupled to the input/output pad 14 via the wiring path 24 connecting the input/output pad 14 with the core circuit 12. The terminal 40 includes the anode of diode 30 and the cathode of diode 32, which are each coupled to the input/output pad 14. The diodes 34, 36 of the anti-parallel diode pair 35 are also connected in parallel but with their polarities reversed. A terminal 44 of the anti-parallel diode pair 35 is coupled to the Vss rail 18. The terminal 44 includes the cathode of diode 34 and the anode of diode 36, each of which is coupled to the Vss rail 18.

The anti-parallel diode pair 31 of the protection circuit 28 is connected in series with the anti-parallel diode pair 35 of the protection circuit 28. Specifically, a terminal 42 of the anti-parallel diode pair 31 and a terminal 46 of the anti-parallel diode pair 35 are coupled at a node 48. The diodes 30, 32 of the anti-parallel diode pair 31 are connected in parallel but with their polarities reversed. The terminal 42 includes the cathode of diode 30 and the anode of diode 32, each of which is coupled to the node 48. The terminal 46 includes the anode of diode 34 and the cathode of diode 36, each of which is coupled to the node 48. The offset pad 38 is coupled to the node 48 and, as a consequence, is coupled with both of the anti-parallel diode pairs 31, 35.

In use and while the chip 10 is unpowered, the offset pad 38 is electrically floating. An ESD event occurring at the input/output pad 14 will create a sufficient potential difference to activate the anti-parallel diode pairs 31, 35 of the protection circuit 28. Such ESD events may occur, for example, during packaging, wire bonding, or handling. Upon activation, the anti-parallel diode pairs 31, 35 define a current path that shunts the current from an ESD event to the Vss rail 18 through diode 30 and diode 34, and away from the core circuit 12 so that the core circuit 12 receives full ESD protection. The gate oxide of the transistors in the inverter 22 are protected because the voltage at the transistor gates during the ESD event is equal to the voltage drop across diodes 30, 34, which may be less than the breakdown voltage of the gate oxide. For example, the voltage drop across each of the diodes 30, 34 may be 0.6 to 0.7 volts, which results in a voltage at the transistor gates of less than 1.4 volts.

A signal source 50 is coupled by the offset pad 38 with the node 48. When the chip 10 is powered and operating, the offset pad 38 receives, from the signal source 50, an independently-driven duplicate (i.e., an exact copy) of the signal received at the input/output pad 14. The signal source 50 may tap the signal source 26 supplying the signal or the line delivering the signal from the signal source 26 to the input/output pad 14 in order to simultaneously supply the independently-driven duplicate of the signal received at the offset pad 38, or control logic may synchronize the delivery of the signals from the signal sources 26, 50. As a result of the duplicate signal, the potential at the input/output pad 14 and the potential at the offset pad 38 are nominally the same at any instant in time during the operation of the chip 10. In an embodiment, the duplicate signal received at the offset pad 38 may lead or trail the signal received at the input/output pad 14 so long as the delay is less than the signal rise time.

Because an equal potential is present on both of the terminals 40, 42 of the anti-parallel diode pair 31 under normal operating conditions, the protection circuit 28 and, in particular, the anti-parallel diode pair 31 will isolate the leakage current and output a negligible leakage current that can be sensed at the input/output pad 14 of the core circuit 12. In an embodiment, the leakage current of the protection circuit 28 may be zero. The core circuit 12 will sense the zero or negligible leakage current even under high voltage or temperature stress conditions during Electrical Over-Stress (EOS) and/or ESD events, or if the diodes 30, 32, 34, 36 become leaky after several EOS and/or ESD events. Even when the chip 10 is powered, the protection circuit 28 may respond to an ESD event by shunting the ESD current to the Vss rail 18 through diode 30 and diode 34, and away from the core circuit 12 so that the core circuit 12 receives full ESD protection.

The protection circuit 28 may provide a simple universal solution for any vulnerable input/output pad that receives either positive or negative signals, and may be replicated to protected multiple different input/output pads on a chip 10. The protection circuit 28 provides robust ESD protection for the entire chip 10. The layout area for the protection circuit 28 is compact with a requirement of, for example, only four (4) diodes per input/output pad in the representative embodiment.

The diode-based ESD protection circuit 28 features structure/network simplicity, high efficiency, and small parasitic effects (e.g., the added equivalent capacitance may be equal to that of a single diode). For low power applications, the reduced leakage current from the protection circuit 28 may reduce the whole circuit leakage and power consumption in comparison with known diode-based ESD protection circuits. Because the reduction in leakage current may prevent operation-current-comparable leakage from being injected into the core circuit 12, the protection circuit 28 may reduce the incidence of false characterization of a protected core circuit during testing or even the malfunction of a protected core circuit. The protection circuit 28 provides an improved compromise between ESD performance and leakage, especially for advanced low-voltage CMOS technologies, by suppressing leakage current without a concomitant increase in the number of diodes in a diode string, as needed in known diode-based ESD protection circuits to suppress leakage current. Increasing the number of diodes in a diode string in a known diode-based ESD protection circuit may increase the trigger voltage, the on-resistance, and the layout area. In particular, an increased trigger voltage in known protection circuits resulting from an increase in the number of diodes may escalate the risk of ESD-induced damage and degradation.

Over the lifetime of the protected core circuit 12, the protection circuit 28 may be less likely than conventional protection circuits to exhibit leakage increase or to fail after absorption of high-voltage ESD stresses or electrical over-stress (e.g., arising from thermal heating and reliability stresses) so as to potentially cause damage to a protected core circuit and/or make the protected core circuit susceptible to damage from a future ESD or EOS event. For example, during module level reliability qualification, single devices having minimum dimension are often qualified under high temperature and long term DC stress, and known protection circuits may be stressed to the point of failure or to induce high leakage currents later during normal chip operation. As the technology node scales down, the protection circuit 28 may present a design that is effective to protect the core circuit 12 against ESD, yet characterized by leakage currents that are significantly less than operation currents of the core circuit 12.

Figure 2:
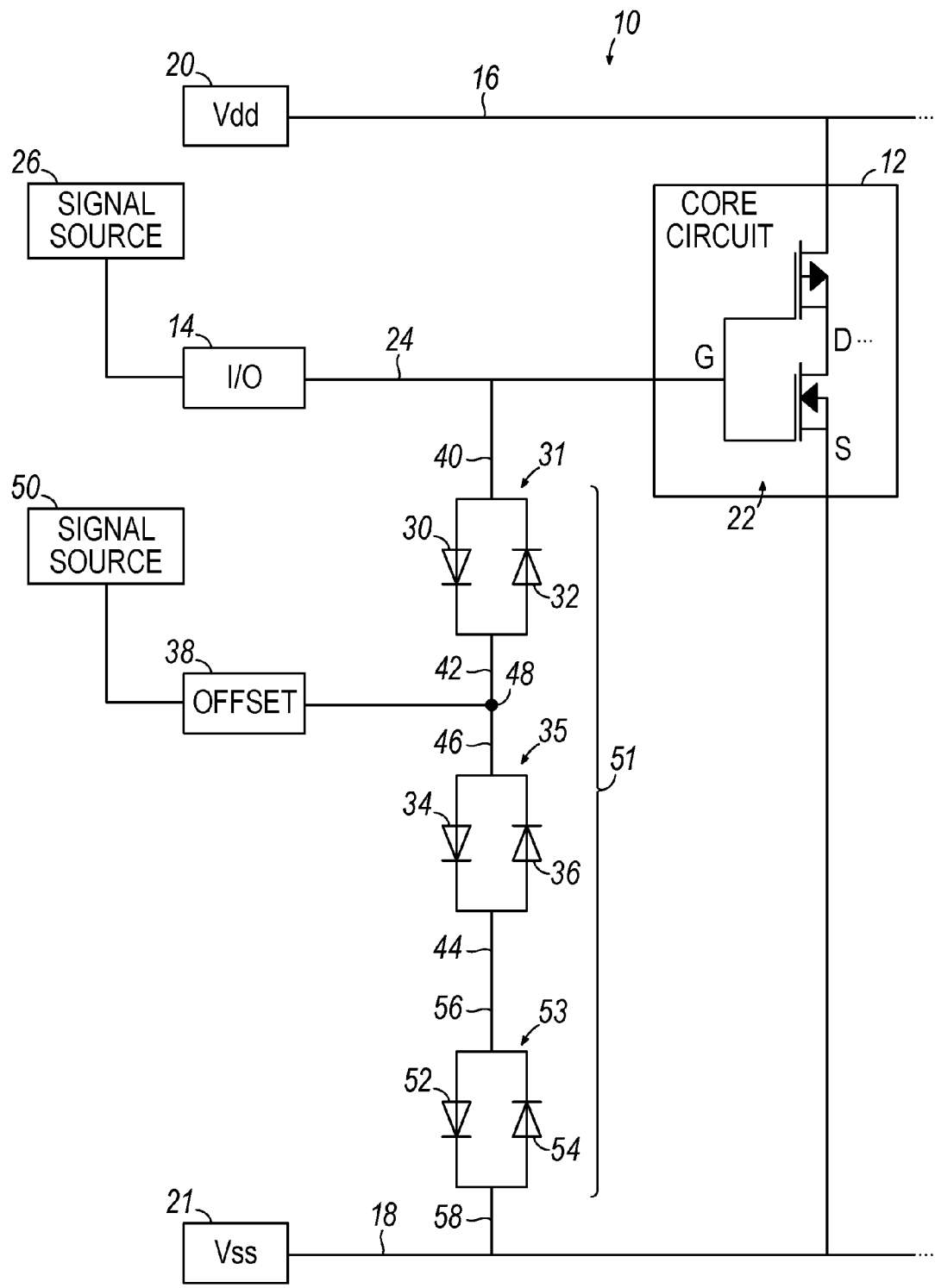
FIG. 2 is a circuit diagram that includes a protection circuit in accordance with an alternative embodiment of the invention.

With reference to FIG. 2 in which like reference numerals refer to like features in FIG. 1 and in accordance with an alternative embodiment, a protection circuit 51 may modify the protection circuit 28 to include an additional anti-parallel diode pair 53 that is inserted between the node 48 and the Vss rail 18. The anti-parallel diode pair 53 of the protection circuit 51 is connected in series with the anti-parallel diode pair 35 of the protection circuit 51. The anti-parallel diode pair 53 includes diodes 52, 54 that are connected in parallel but with their polarities reversed. A terminal 56 of the anti-parallel diode pair 53 is indirectly coupled to the node 48 and directly coupled with the terminal 44 of the anti-parallel diode pair 35. The terminal 56 includes the anode of diode 52 and cathode of diode 54, each of which is directly coupled to the terminal 44 and indirectly coupled to the node 48. Another terminal 58 of the anti-parallel diode pair 53 is coupled with the Vss rail 18.

The protection circuit 51 including the additional anti-parallel diode pair 53, which is stacked in series with the anti-parallel diode pair 35 in the representative embodiment, may offer weaker ESD performance because of an increased clamp and/or trigger voltage. However, the protection circuit 51 may also exhibit a further reduced leakage current (e.g., at the offset pad 38, or of the whole chip) because of the presence of the additional anti-parallel diode pair 53

The method and circuit as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electrostatic discharge protection circuit coupled to an input/output pad that is coupled to a first terminal of a core circuit, the electrostatic discharge protection circuit comprising:
   a first anti-parallel diode pair including a first terminal coupled to the input/output pad and a second terminal;
   a second anti-parallel diode pair including a first terminal coupled to the second terminal of the first anti-parallel diode pair and a second terminal coupled to a negative power supply voltage, the second anti-parallel diode pair coupled in series with the first anti-parallel diode pair at a node; and
   a second pad coupled to the node, the second pad configured to receive a first signal that is the same as a second signal that is received at the input/output pad, wherein the second pad is not coupled to the core circuit.

2. The electrostatic discharge protection circuit of claim 1 further comprising:
   a signal source coupled to the second pad, the signal source configured to communicate the first signal to the second pad.

3. The electrostatic discharge protection circuit of claim 2 wherein the signal source is independently driven from an external signal source providing the second signal to the input/output pad.

4. The electrostatic discharge protection circuit of claim 3 wherein the signal source and the external signal source are synchronized such that the first signal and the second signal are simultaneously received at the input/output pad and the second pad.

5. The electrostatic discharge protection circuit of claim 1 wherein the first terminal of the first anti-parallel diode pair comprises an anode of a first diode and a cathode of a second diode, and the second terminal of the first anti-parallel diode pair comprises a cathode of the first diode and an anode of the second diode.

6. The electrostatic discharge protection circuit of claim 5 wherein the first terminal of the second anti-parallel diode pair comprises an anode of a third diode and a cathode of a fourth diode, and the second terminal of the second anti-parallel diode pair comprises a cathode of the third diode and an anode of the fourth diode.

7. The electrostatic discharge protection circuit of claim 1 further comprising:
   a third anti-parallel diode pair coupled in series with the second anti-parallel diode pair and coupling the second anti-parallel diode pair to the negative power supply voltage.

8. A method of protecting a core circuit coupled with an input/output pad that is coupled to a first terminal of the core circuit from electrostatic discharge, the method comprising:
   receiving a first signal at the input/output pad; and
   receiving a second signal at a second pad coupled with a node between a first anti-parallel diode pair including a first terminal coupled to the input/output pad and a second terminal and a second anti-parallel diode pair including a first terminal coupled to the second terminal of the first anti-parallel diode pair and a second terminal coupled to a negative power supply voltage, wherein the second pad is not coupled to the core circuit, and wherein the second signal is the same as the first signal received at the input/output pad.

9. The method of claim 8 wherein the second signal is received from a signal source that is independently driven from an external signal source providing the first signal to the input/output pad.

10. The method of claim 8 wherein the first signal and the second signal are simultaneously received such that a potential difference across the first anti-parallel diode pair is equal to zero.

11. The method of claim 8 wherein the second anti-parallel diode pair is coupled in series with the first anti-parallel diode pair at the node.

12. The method of claim 8 wherein the first signal and the second signal are received when the core circuit is powered by a power supply.

13. The method of claim 12 further comprising:
shunting a current from an electrostatic discharge event at the input/output pad through the first anti-parallel diode pair and the second anti-parallel diode pair to a rail connected with the negative power supply voltage.

14. The method of claim 8 further comprising:
when the core circuit is not powered, activating the first anti-parallel diode pair and the second anti-parallel diode pair to shunt a current from an electrostatic discharge event at the input/output pad to a rail connected with the negative power supply voltage.

15. The electrostatic discharge protection circuit of claim 7 wherein the third anti-parallel diode comprises a first terminal coupled to the second terminal of the second anti-parallel diode pair and a second terminal directly coupled to the negative power supply voltage.

16. The electrostatic discharge protection circuit of claim 15 wherein the first terminal of the third anti-parallel diode pair comprises an anode of a fifth diode and a cathode of a sixth diode, and the second terminal of the third anti-parallel diode pair comprises a cathode of the fifth diode and an anode of the sixth diode.

17. The electrostatic discharge protection circuit of claim 1 wherein the second terminal of the second anti-parallel diode pair is coupled to the negative power supply voltage through a negative power supply rail, the negative power supply rail connecting the negative power supply with a second terminal of the core circuit.

18. The electrostatic discharge protection circuit of claim 1 further comprising a positive power supply rail connecting a third terminal of the core circuit with a positive power supply.

19. The electrostatic discharge protection circuit of claim 1 wherein the input/output pad is coupled to the first terminal of the core circuit through a wiring path, wherein the first terminal of the first anti-parallel diode pair is coupled to the input/output pad via the wiring path.

* * * * *